United States Patent [19]

Darakjy et al.

[11] 4,249,033
[45] Feb. 3, 1981

[54] VENTED RADIO FREQUENCY SHIELDED ENCLOSURE

[75] Inventors: David L. Darakjy; Leland A. Zanteson, both of Pasadena, Calif.

[73] Assignee: System Development Corporation, Santa Monica, Calif.

[21] Appl. No.: 29,725

[22] Filed: Apr. 13, 1979

[51] Int. Cl.³ .............................................. H05K 9/00
[52] U.S. Cl. ............................ 174/16 R; 174/35 R; 361/384; 361/424
[58] Field of Search ............ 174/16 R, 35 R, 35 MS; 361/383, 384, 424, 429

[56] References Cited

U.S. PATENT DOCUMENTS 3,124,720  3/1964  Green ............................ 361/383
3,553,343  1/1971  Garlington ................... 174/35 MS Primary Examiner—Roy N. Envall, Jr.
Assistant Examiner—David A. Tone
Attorney, Agent, or Firm—Christie, Parker & Hale

[57] ABSTRACT

A ventilated enclosure for shielding electronic equipment from radio frequency energy having a minimum wavelength λ which comprises a metal container forming a fully enclosed volume in which the electronic equipment is mounted. Cooling means, such as a fan, directs air through the volume to cool the equipment. The air enters and leaves the volume through an inlet duct and an outlet duct, respectively. Each duct forms a waveguide having a major cross-sectional dimension less than λ/2 and a length of the order of 2 λ or greater.

1 Claim, 4 Drawing Figures

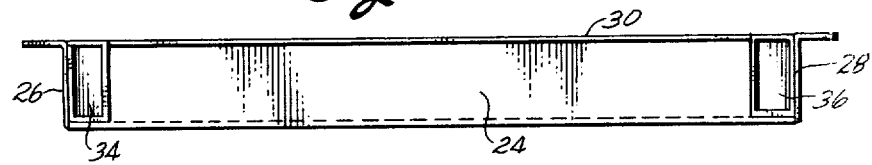
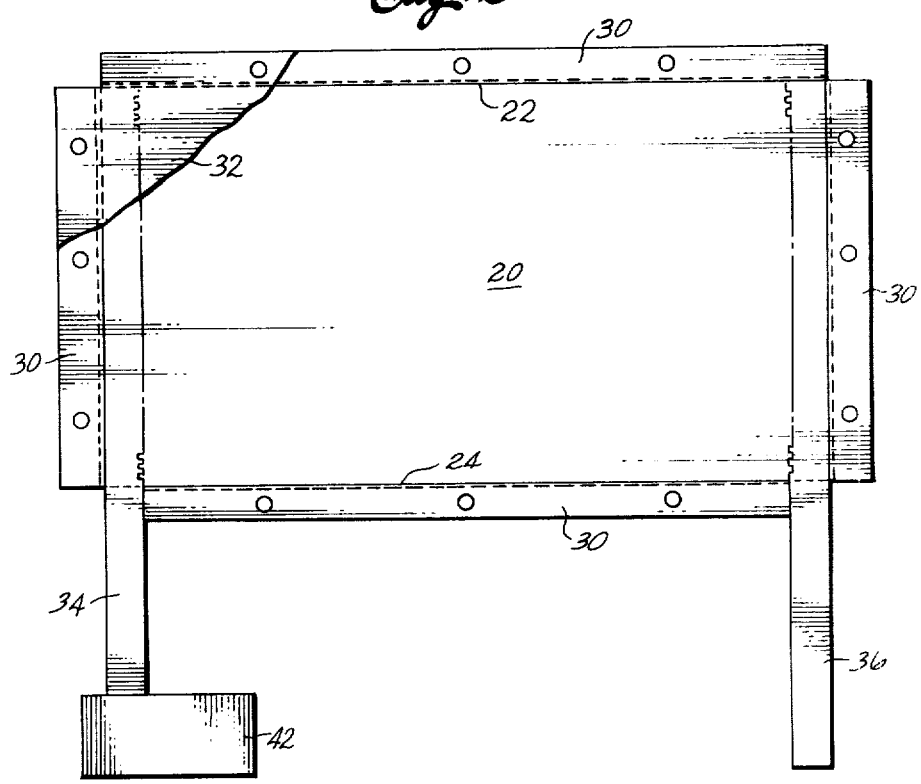

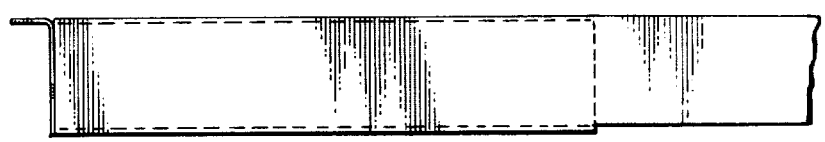
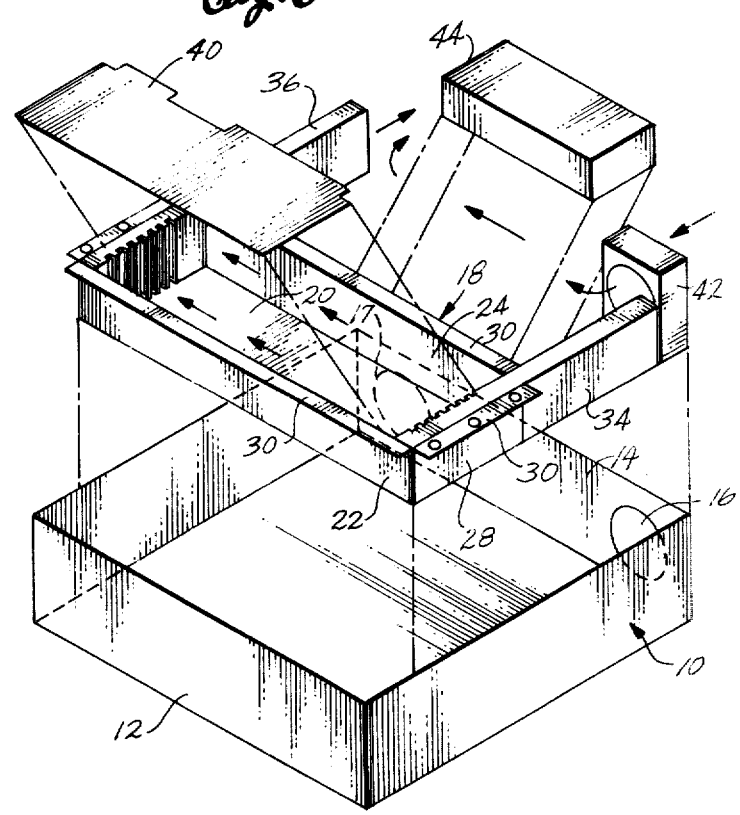

VENTED RADIO FREQUENCY SHIELDED ENCLOSURE

FIELD OF THE INVENTION

This invention relates to ventilated enclosures for electronic equipment, and more particularly, to an enclosure shielded against radio frequency interference.

BACKGROUND OF THE INVENTION

The need for shielding electronic equipment both to prevent radiation of radio frequency energy from the equipment or to shield the equipment from external radiation is well known. While fully enclosing the circuit in a tight metal box would fully shield the circuit, this presents heat dissipation problems. Ventilated metal enclosures have heretofore been employed in which the air passes through a metal screen or through a metal honeycomb structure. While the honeycomb structure provides higher attenuation of radio frequency energy, these filters are expensive to manufacture and the tubular openings of the honeycomb structure tend to plug with dirt, reducing air flow and requiring a heavier duty fan than otherwise would be required.

SUMMARY OF THE INVENTION

The present invention is directed to an improved shielded enclosure for electronic circuits which is ventilated by moving air through the shielded enclosure in a free-flowing pattern, but which provides a very high attenuation of radio frequency energy between the interior of the shielded compartment and the exterior region of the compartment from which the ventilating air is drawn. This is accomplished, in brief, by providing an enclosure for shielding electronic equipment from radio frequency energy having a minimum wavelength $\lambda$ comprising a metal container forming a fully enclosed volume in which the electronic equipment is mounted. Cooling means for directing air through the volume to cool the equipment includes an inlet duct and an outlet duct made of conductive material and a fan for directing air through the ducts and the container. Each duct forms a waveguide having a major cross-sectional dimension less than $\lambda/2$ and a length which is of the order of $2\lambda$ or greater.

BRIEF DESCRIPTION OF THE DRAWINGS

For a better understanding of the invention reference should be made to the accompanying drawings; wherein:

FIG. 1 is a side view of the shielded enclosure;

FIG. 2 is a top view of the ventilated enclosure with the top panel removed;

FIG. 3 is an exploded isometric view of the shielded enclosure assembly of the present invention;

FIG. 4 is an end view of the shielded enclosure.

DETAILED DESCRIPTION

Referring to the drawings in detail, the numeral 10 indicates generally an outer metal cabinet or case with the top removed. The outer case has a front panel 12 on which the controls for the electronic circuit (not shown) are normally mounted. A back wall 14 has openings 16 and 17 at either corner. The openings permit air to circulate in and out of the interior of the case 10.

The ventilated shielded enclosure assembly, indicated generally at 18, fits inside the case 10. The construction of the enclosure assembly 18 is shown in detail FIGS. 2, 3, and 4. The enclosure assembly includes a sheet metal box having integral bottom wall 20, side walls 22 and 24, and end walls 26 and 28. The side walls and end walls are formed with outwardly projecting flanges 30 to which a top plate, a portion of which is indicated at 32 in FIG. 2, is bolted. A metal gasket suitable for shielding against leakage of RF energy may be provided at the interface between the top cover 32 and the mounting flanges 30. A pair of slots are provided in the side wall 24 adjacent the end walls 26 and 28 for receiving a pair of rectangular tubular ducts 34 and 36. One end of the ducts abuts the side wall 22, which closes off the end of the duct. The ducts extend out through the slots in the side wall 24, thereby sealing off the interior of the enclosure. The inner walls of the ducts 34 and 36 within the enclosure are provided with openings to discharge or exhaust air between the ducts and the enclosure. The openings are preferably in the form of vertical slots for ease of manufacture, but the shape of the openings is not critical.

After one or more circuit cards 40 are mounted in horizontal position within the enclosure and wiring brought out through suitable shielded plugs (not shown) the cover 32 is bolted in place and the enclosure assembly 18 is dropped into the case 10. The length of the duct 36 is such that when the assembly is positioned in the case, the outer end of the duct 36 abuts the back wall 14 of the case in alignment with the opening 17. The duct 34 is made slightly shorter than the duct 36, leaving a gap between the outer end of the duct 34 and the back wall 14 of the case. A fan assembly 42 is positioned in the gap at the rear corner of the case 10. The fan draws air in through the opening 16, discharging air into the interior of the case 10 and into the open end of the duct 34. Thus the fan forces air through the duct 34 interior of the enclosure assembly where it cools the electronic circuits mounted on the circuit cards 40, and discharging through the duct 36 and opening 17. A power supply 44 may be between the outer ends of the ducts where it is cooled by air circulating directly from the fan to the opening 17. The circulation of air is shown by the arrows in FIG. 3.

A significant feature of the present invention is that the ducts 34 and 36 while conveying air for ventilation of the exterior of the enclosure act as attenuating waveguides for radio frequency radiation having a wavelength which is longer than twice the larger cross-sectional dimension of the ducts. The cutoff frequency of a rectangular wave guide transmitting in the TE mode corresponds to the frequency at which the larger cross-sectional dimension is equal to $\lambda_c/2$, where $\lambda_c$ is the wavelength at the cutoff frequency. For radio frequencies below the cutoff frequency, the waveguide provides relatively high attenuation, as given by the expression $db = 54.5 \, d$, where d is the length of the waveguide $D/\lambda_c$. For example, assuming ducts which are 1½ inches by ¾ inches in cross-section, which provides circulation of air at relatively low pressure drops, the cutoff frequency would be in the order of 4000 megahertz. A length of 6 inches, corresponding to approximately to $2\lambda_c$ provides an attenuation of over 100 db at frequencies below the cutoff frequency. Thus the open ducts provide good air circulation while at the same time providing high attenuation of radio frequency energy through the wave-guides.

What is claimed is:

1. A ventilated enclosure providing shielding of electronic equipment from external radio frequency energy up to frequencies of the order of 3000 megahertz, comprising an inner metal container forming a chamber surrounding the equipment, hollow rectangular input and output ducts connected to said chamber, the ducts being parallel to each other and forming the end walls of the inner container, the ducts having openings within the container, an outer fully enclosed container surrounding the metal container and the ducts, the outer container forming a chamber between the outer ends of the ducts, the outer container having openings opposite the outer ends of the ducts, the openings being larger than the ends of the ducts, and means directing air into the outer container through one of said openings, a portion of the air being directed through the outer container and out the other opening and a portion of the air being directed through said ducts and said inner container for cooling the equipment in the chamber, the ducts operating as waveguide means having a cutoff frequency above the frequencies of said external radio frequency energy, the length of the ducts forming the waveguide means being of the order of at least twice the freespace wavelength at said cutoff frequency of the radio frequency energy.

* * * * *